US011488921B2

(12) United States Patent
Roshanghias et al.

(10) Patent No.: US 11,488,921 B2
(45) Date of Patent: Nov. 1, 2022

(54) MULTI-CHIP DEVICE, METHOD OF MANUFACTURING A MULTI-CHIP DEVICE, AND METHOD OF FORMING A METAL INTERCONNECT

(71) Applicant: Infineon Technologies AG, Neubiberg (DE)

(72) Inventors: Ali Roshanghias, Villach (AT); Alfred Binder, Landskron (AT); Barbara Eichinger, Villach (AT); Stefan Karner, Klagenfurt (AT); Martin Mischitz, Wernberg (AT); Rainer Pelzer, Wernberg (AT)

(73) Assignee: Infineon Technologies AG, Neubiberg (DE)

(*) Notice: Subject to any disclaimer, the term of this patent is extended or adjusted under 35 U.S.C. 154(b) by 48 days.

(21) Appl. No.: 17/060,434

(22) Filed: Oct. 1, 2020

(65) Prior Publication Data

US 2021/0098410 A1    Apr. 1, 2021

(30) Foreign Application Priority Data

Oct. 1, 2019 (DE) .......................... 102019126505.3

(51) Int. Cl.
*H01L 23/00* (2006.01)
*H01L 25/00* (2006.01)
*H01L 25/065* (2006.01)

(52) U.S. Cl.
CPC ............ *H01L 24/29* (2013.01); *H01L 24/27* (2013.01); *H01L 24/73* (2013.01); *H01L 24/83* (2013.01); *H01L 24/93* (2013.01); *H01L 25/0657* (2013.01); *H01L 25/50* (2013.01); *H01L 2224/27418* (2013.01); *H01L 2224/29005* (2013.01); *H01L 2224/29139* (2013.01); *H01L 2224/29147* (2013.01); *H01L 2224/73215* (2013.01); *H01L 2224/73265* (2013.01); *H01L 2224/8384* (2013.01); *H01L 2224/83207* (2013.01)

(58) Field of Classification Search
CPC ............ H01L 2224/80207; H01L 2224/83207
See application file for complete search history.

(56) References Cited

U.S. PATENT DOCUMENTS

| 2010/0148282 | A1  | 6/2010 | Donis et al. |
| 2010/0207263 | A1* | 8/2010 | Nikitin ................... H01L 25/50 257/690 |
| 2018/0240776 | A1  | 8/2018 | Osterwald et al. |

FOREIGN PATENT DOCUMENTS

| DE | 102009017853 A1 | 11/2009 |
| DE | 102010000402 A1 | 9/2010 |
| DE | 102014115319 A1 | 4/2016 |
| DE | 102017113153 A1 | 12/2018 |
| WO | 2008006340 A1 | 1/2008 |
| WO | 2013185839 A1 | 12/2013 |

* cited by examiner

*Primary Examiner* — Yu-Hsi D Sun
(74) *Attorney, Agent, or Firm* — Murphy, Bilak & Homiller, PLLC

(57) ABSTRACT

A multi-chip device is provided. The multi-chip device includes a first chip, a second chip mounted on the first chip, and a hardened printed or sprayed electrically conductive material forming a sintered electrically conductive interface between the first chip and the second chip.

26 Claims, 14 Drawing Sheets

106, 106C

102S

MULTI-CHIP DEVICE, METHOD OF MANUFACTURING A MULTI-CHIP DEVICE, AND METHOD OF FORMING A METAL INTERCONNECT

TECHNICAL FIELD

Various embodiments relate generally to a multi-chip device, to a method of manufacturing a multi-chip device, and to a method of forming a metal interconnect.

BACKGROUND

Recently, the ever growing interest for 3D integration of integrated circuits (IC) with low RC delay, high speed, improved bandwidth and high temperature performance, made metal (e.g. Cu) interconnects a preferred choice. The emerging 3D IC stacking technology as one of the main platforms for 3D integration, which means that two or more silicon dies/wafers are integrated vertically, can be a potent use-case for metal to metal bonding.

The IC stacking is currently achieved in back-end (BE) by chip-on-chip stacking. One of the major challenges during a die attach process of the top chip is to achieve an even spreading of die attach material (e.g., glue, solder paste, solder) underneath the chip to be attached. Even spreading in this context means a flat spreading of the die attach material covering an area with a uniform, reproducible thickness. This may be achieved by fine tuning a volume and a pattern of dispensed material.

However, placing the top chip on the bottom chip in this way is a complex process that usually requires doubling a pick-and-place and a curing process, which causes high costs. Furthermore, this process poses an increased risk of contaminating surfaces of the chip—at a point during the production when a post-processing of the chip surface or an early (e.g., immediate) optical and/or electrical evaluation of the interconnect are not foreseen.

Controlling the arranging of the die attach material to form a layer that is as thin and even as possible is paramount when joining two vertically stacked power chips.

All-Copper interconnects are one type of die attach material that is regularly used for 3D stacking. They solve problems of solder joining and Solid-Liquid Interdiffusion (SLID) bonding, offer high conductivity and high reliability interconnects, and high-temperature stability (above 200° C.), which is vital for high power and RF devices, as well as for emerging SiC and GaN interconnect technologies.

At present, 3D IC stacking is dominated by tin or gold-based solder materials. Silver sinter-bonding, as well as adhesive bonding, are also found in the industry. Local thermal compression on each die for 3D application is a common practice in industry that offers reliable interconnects with demonstrated bond stability at high temperature, but the process requires high bonding temperature (up to 400° C.), high pressure (up to 50 MPa), and a long time (up to some minutes). A tacking and gang bonding process (chip to wafer) is a preferred choice, because it offers higher throughput than a local thermal compression process (chip to chip), thereby reducing at least the processing time per IC.

Cu-based interconnect formation is in principle the preferable choice for semiconductor industries, since it not only has excellent electrical and mechanical properties, but also has an excellent electromigration resistance.

Research in all-Cu die-attachments is limited mainly to thermo-compression bonding. However, the native oxide layer of Cu acts as diffusion barrier and thus necessitates higher temperature and pressure for bond formation. Diffusion of atoms across Cu—Cu layers is the key factor for thermocompression bonding. Due to the high pressure and temperature involved in the process, it might be of interest essentially only for the bulk, since such processing parameters can be detrimental for brittle semiconductor die-attachment.

To date, no cost-effective, manufacturable all-Cu interconnection technology, combining low bonding temperatures and pressures, and short assembly cycle times has been provided.

This means that an efficient approach for Cu to Cu bonding is still an unsolved problem for many electronic packaging factories.

SUMMARY

A multi-chip device is provided. The multi-chip device includes a first chip, a second chip mounted on the first chip, and a hardened printed or sprayed electrically conductive material forming a fixed electrically conductive interface between the first chip and the second chip.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

each of FIG. 5A

DETAILED DESCRIPTION

Figure 1A:
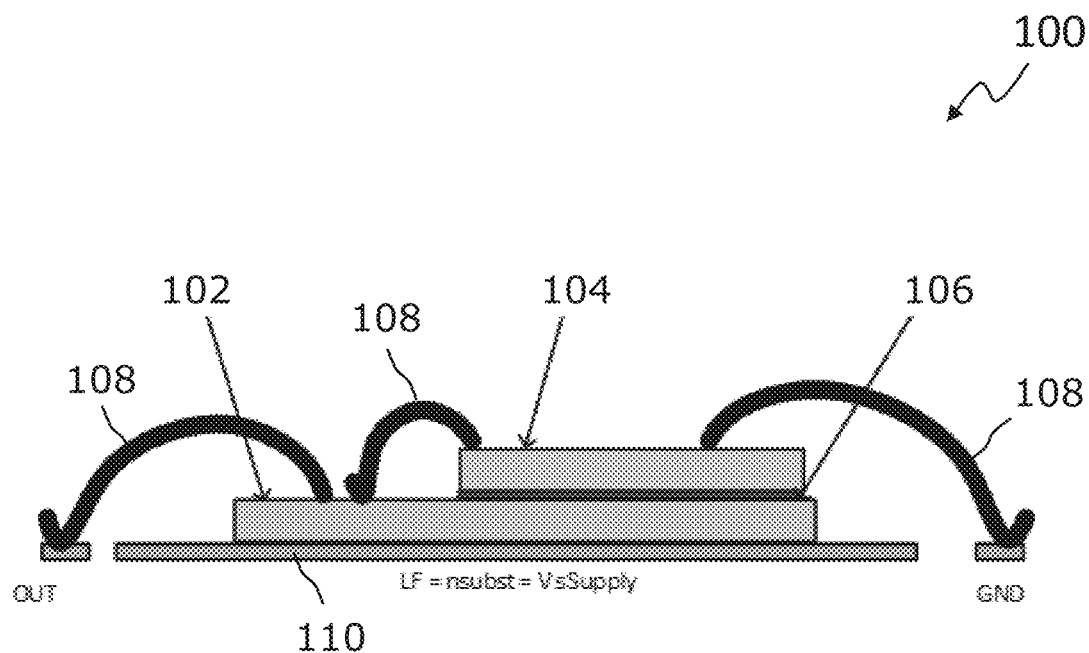
FIG. 1A shows a schematic cross-sectional view of a multi-chip device in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

A method of forming a chip-on-chip connection of vertical power semiconductor devices is provided. The method may include depositing an electrically conductive paste at wafer level.

In various embodiments, a process of forming a low resistance interconnect between two front end technologies is provided. An electrically conductive paste may be printed or sprayed onto one or both of the frontend technology devices in a frontend process and used as an interconnect. The interconnect may be a sinter interconnect formed using pressure and heat under a controlled atmosphere or an electrically conductive adhesive.

In various embodiments, a thermosonic die-stacking method, also referred to as a 3D integration technology of semiconductor devices, with low thermal budget under low bonding pressure is provided. The thermosonic bonding of copper (Cu) to copper (Cu) may be used for any all-Cu interconnects in semiconductor industry. In various embodiments, thermosonic bonding may be used for forming a copper-silver interconnect or a silver-silver interconnect.

In various embodiments, the thermosonic bonding may for example be used for a tacking process prior to aggregate thermal annealing in a multi-chip to wafer configuration, and/or for a permanent 3D IC stacking process in a chip to wafer or chip to chip configuration.

A metallization (e.g. copper) of the semiconductor dies may in various embodiments be formed by screen/stencil printing of sinterable copper pastes, or by electroless/electroplating. The metallizations of the dies to be bonded may be exploited directly as a die-attach material. Therefore, the dies may be bonded without any additional materials to another chip or wafer that has a suitable (e.g. Cu) metallization.

In various embodiments, the surfaces of the two components (e.g. dies) may be subjected to static forces (e.g., pressure) and oscillating shearing forces (e.g., ultrasonic energy), which may produce a strong solid-state bond. Combining the static forces with the oscillating shearing forces may allow to reduce an assembly temperature and the applied pressure, as compared with thermocompression bonding.

Low temperature bonding may be vital for materials undergoing oxidation, such as copper (Cu). A low bonding force may also be beneficial in various circumstances, for example in a case of a brittle semiconductor material, or the like.

Figure 1B:
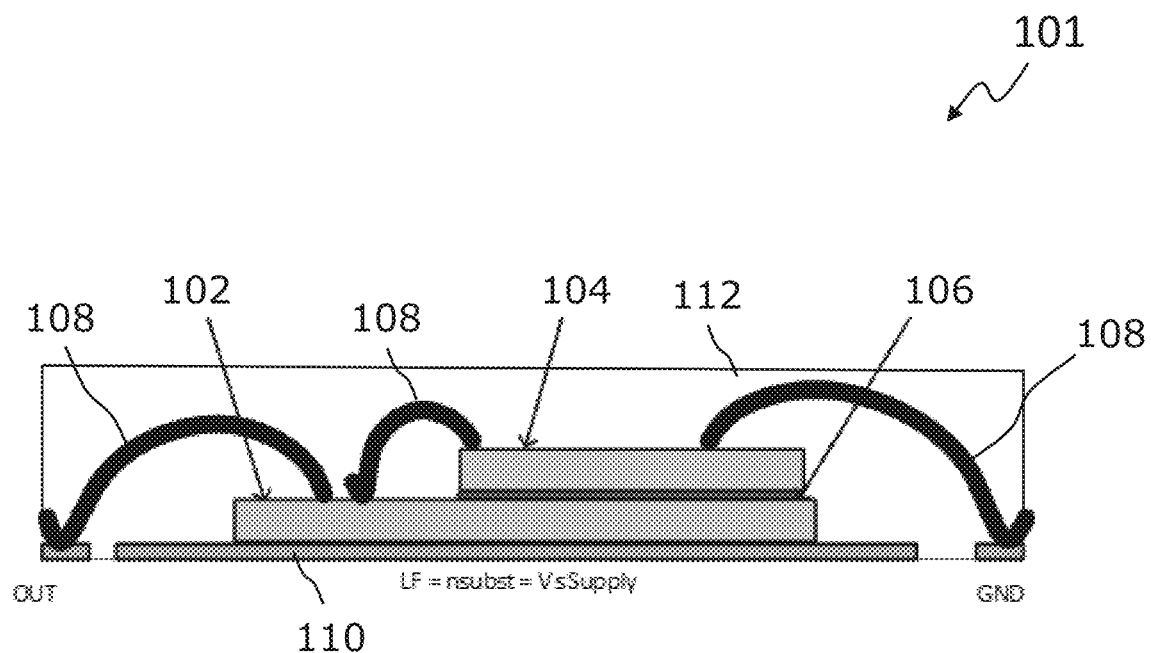
FIG. 1B shows a schematic cross-sectional view of a multi-chip package 101 in accordance with various embodiments.
Figure 12:
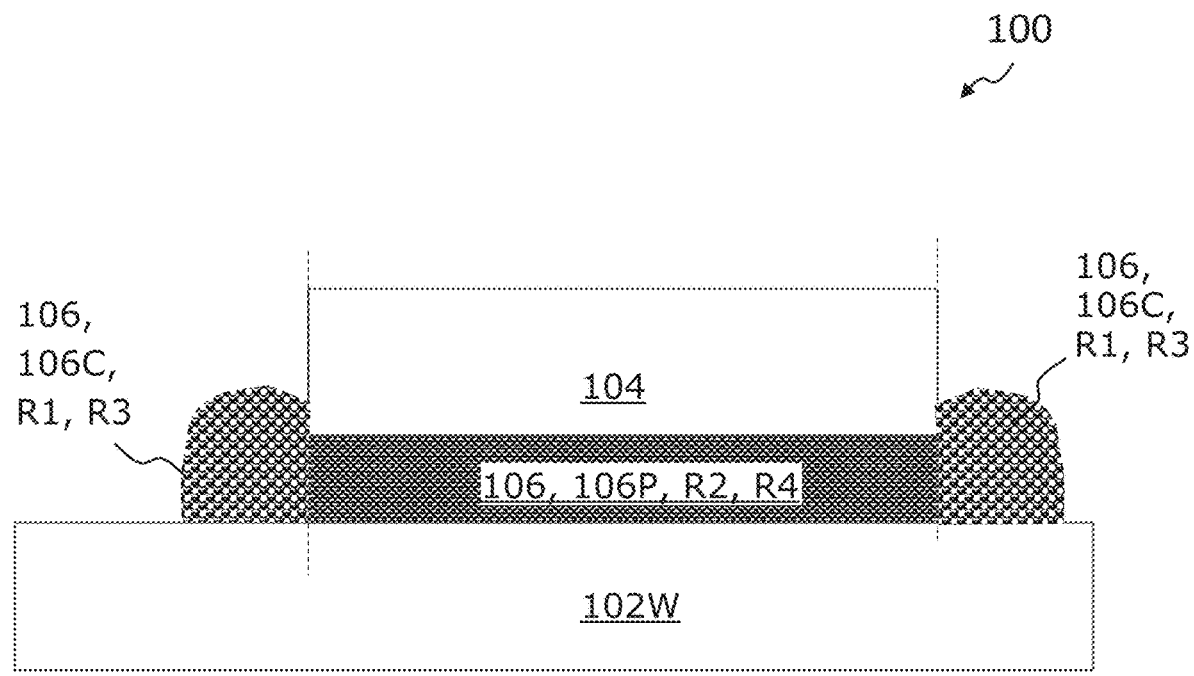
FIG. 12 shows a cross-sectional schematic view of a multi-chip device in accordance with various embodiments.

FIG. 1A shows a schematic cross-sectional view of a multi-chip device 100 in accordance with various embodiments. FIG. 1B shows a schematic cross-sectional view of a multi-chip package 101 in accordance with various embodiments. FIGS. 2A to 2D are a visualizations of a method of manufacturing a multi-chip device 100 in accordance with various embodiments. FIG. 3A to 3E are a visualization of a method of manufacturing a multi-chip device 100 in accordance with various embodiments, FIG. 4A to 4G are a visualization of a method of manufacturing a multi-chip device 100 in accordance with various embodiments, and FIG. 12 shows a cross-sectional schematic view of a multi-chip device in accordance with various embodiments.

In various embodiments, the multi-chip device 100 may include a first chip 102, a second chip 104 mounted on the first chip, and a hardened printed or sprayed electrically conductive material forming a fixed electrically conductive interface 106 between the first chip 102 and the second chip 104. The fixed electrically conductive interface 106 may also be referred to as interconnect 106. As will be described in more detail below, the interconnect 106 may undergo various stages during its formation. The interconnect may for example initially include or consist of an electrically conductive material that may have a paste-like texture, which may make it printable or sprayable. Subsequently it may be dried, cured, annealed, pressed, heated and/or treated with ultrasound or ultraviolet light, which may harden the electrically conductive material 106. Depending on the processing stage, and to make an understanding easier, the various stages of the interconnect 106 may be differentiated by appended letters, e.g. 106U for the electrically conductive material 106 after the spraying/printing, 106C for the cured material 106, etc.

The first chip 102 and/or the second chip 104 may include or consist of any kind of semiconductor chip, for example a semiconductor chip including a semiconductor substrate 102S/104S and an integrated circuit 102EC/104EC formed therein and optionally thereon. The first chip 102 and/or the second chip 104 may for example include or consist of a power semiconductor device. Frontend processing may for example be performed as known in the art. The first chip 102 and/or the second chip 104 may for example include a transistor or a diode.

The first chip 102 may be part of a wafer 102W while the multi-chip device 100 is being assembled, e.g. as described below.

In various embodiments, the fixed electrically conductive interface 106 may be a porous material, for example a porous metal, e.g. porous copper, porous silver, porous gold, or a porous mixture of those metals or of an alloy of those metals. A porosity of the porous material, e.g. the porous material located between the first chip 102 and the second chip 104, may be in the range from about 2% to about 60%, e.g. from about 5% to about 50%, e.g. from about 8% to about 30% or from about 5% to about 25%.

As described in more detail below, an initial porosity of the porous material 106U directly after the printing or spraying may be higher than a final porosity of the porous material 106P after the hardening (at least in an area between the first chip 102 and the second chip 104). The initial porosity may for example be in a range from more than 2% to about 90%, e.g. from about 5% to about 75%, e.g. from about 10% to about 65%.

Since the porosity is reduced by the hardening process, which may include a pressing together of the first chip 102 and of the second chip 104, the porosity of the porous material 106U, 106C may be essentially unaffected by the hardening process. This means that the porous material 106U, 106C that may either have been printed or sprayed in an area that was not intended to be covered by the second chip 104, and/or the porous material 106U, 106C that may have been squeezed out from between the first chip 102 and the second chip 104, may still have the initial porosity or at least a higher porosity than the porous material 106P between the first chip 102 and the second chip 104.

In a similar way, a surface roughness of the electrically conductive material 106 may be lower between the first chip 102 and the second chip 104 than outside this area. In other words, the porous material 106U, 106C that may either have been printed or sprayed in an area that is not configured to be covered by the second chip 104, and/or may have been squeezed out from between the first chip 102 and the second chip 104, may still have an initial surface roughness or at least a higher surface roughness than the porous material 106P between the first chip 102 and the second chip 104.

An initial surface roughness may for example be in a range from about 100 nm to about 50 μm, e.g. in a range from about 300 nm to about 3 μm.

In FIG. 12, a multi-chip device 100 in accordance with various embodiments is shown, in which the above is visualized.

The multi-chip device 100 of FIG. 12 may include a first chip 102 (here, part of a wafer 102W) having a first metal portion (which is omitted in FIG. 12, but its width may correspond to the width covered by the electrically conductive material 106), a second chip 104 having a second metal portion (which is omitted in FIG. 12, but it may essentially or completely cover a bottom surface of the second chip 104) which is smaller than the first metal portion, and an electrically conductive material 106, which may include a pressed portion 106P and a cured portion 106C. The second metal portion may be mounted on the first metal portion via the electrically conductive material 106, wherein the electrically conductive material 106 has a first region R1 uncovered by the second metal portion and a second region R2 covered by the second metal portion. The first region R1 may have a higher surface roughness than the second region R2. Alternatively or additionally, the electrically conductive material 106 may have a third region R3 uncovered by the second metal portion and a fourth region R4 covered by the second metal portion, wherein the third portion R3 has a higher porosity than the fourth region R4. In FIG. 12, the first region R1 is identical with the third region R3, and the second region R2 is identical with the fourth region R4, but more generally, the first region R1 may be different from the third region R3, and the second region R2 may be different from the fourth region R4.

A porosity of the fixed electrically conductive interface 106 may depend on the electrically conductive material 106U that is used, a homogeneity of the surface on which the electrically conductive material 106U is printed or sprayed, and also on a pressure and a temperature during the hardening. This means that a desired porosity may be controlled to a desired value by adjusting the various parameters.

The printed or sprayed electrically conductive material 106, 106U may be a sinterable paste, e.g. a paste that includes microparticles or nanoparticles, for example a sinterable metal paste, e.g. including or consisting of silver (Ag) and/or copper (Cu) and/or gold (Au) that may include particles, which may be micrometer- or nanometer sized, or for example a printable electrically conductive glue, e.g. an electrically conductive silver glue, i.e. comprising or consisting of silver.

The paste 106C—i.e., the electrically conductive material 106, 106U before it is hardened—may be printed onto the second chip 104, e.g. onto the wafer 104W at a wafer level, for example using stencil- or screen printing.

Each of the first chip 102 and the second chip 104 may have a first main surface and an opposite second main surface. The first main surface may for example be a back surface of each of the chips 102, 104, on which a controlled chip contact may be formed, e.g. a drain contact. The second main surface may for example be a front surface of each of the chips 102, 104, on which a further controlled chip contact, e.g. a source contact, may be formed. Additionally, a control chip contact, e.g. a gate contact, may be formed on the front surface. In the exemplary embodiments shown in FIG. 1, FIG. 2A to FIG. 2D, FIG. 3A to FIG. 3E, FIG. 4A to FIG. 4G, and in FIG. 12, the first metal portion may correspond to a front surface chip contact, e.g. the further controlled chip contact, of the first chip 102, and the second metal portion may correspond to a backside chip contact, e.g. the controlled chip contact, of the second chip 104.

Figure 2A:
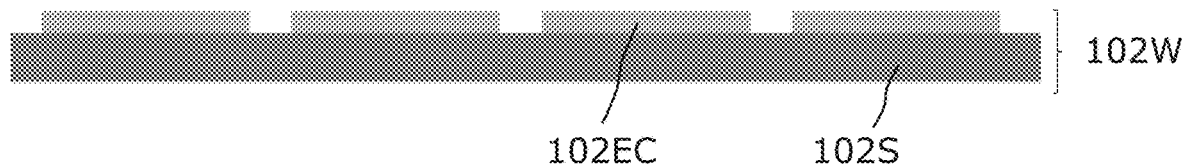
FIG. 2A to 2D are a visualization of a method of manufacturing a multi-chip device in accordance with various embodiments.
Figure 2B:
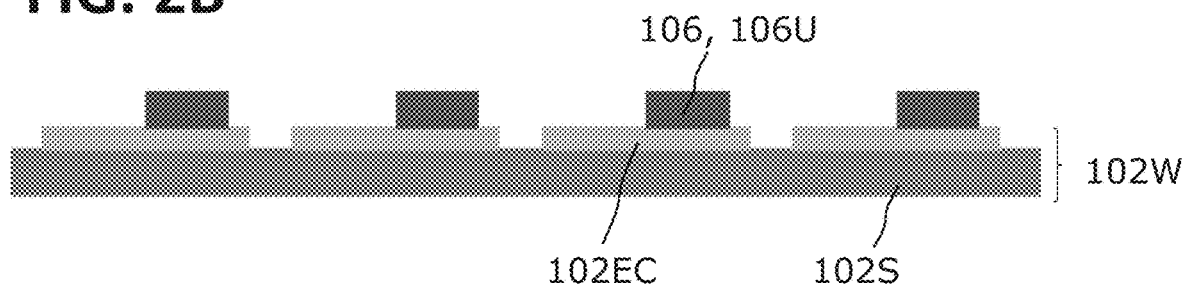

In various embodiments, as for example shown in FIG. 2B, the electrically conductive material 106U may be printed or sprayed onto the first chip 102, 102W, for example onto the second main surface of the first chip 102, 102W. Since the second main surface of the first chip 102, 102W may have the chip contact that may only partially cover the semiconductor surface, the conductive material 106U may be printed or sprayed as a structured layer.

Figure 3A:
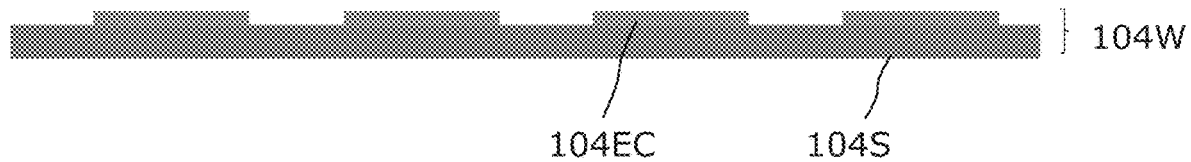
FIG. 3A to 3E are a visualization of a method of manufacturing a multi-chip device in accordance with various embodiments.
Figure 3B:
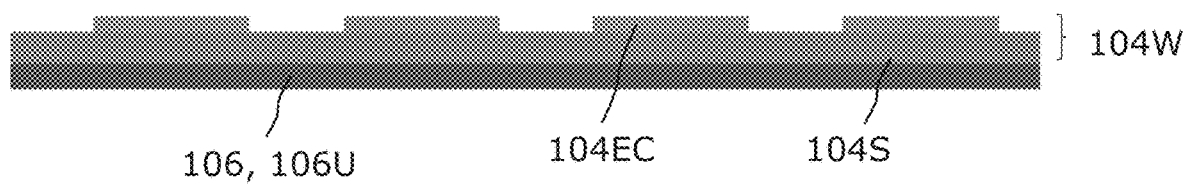

In various embodiments, as for example shown in FIG. 3B, the electrically conductive material 106U may be printed or sprayed onto the first main surface of the second chip 104. Since the first main surface of the second chip 104 has the chip contact extending over the whole first main surface, the whole surface may be covered by the printing or spraying.

Figure 4A:
FIG. 4A to 4G are a visualization of a method of manufacturing a multi-chip device in accordance with various embodiments.
Figure 4B:
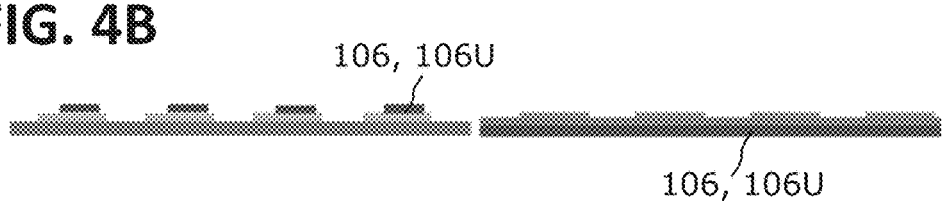

In various embodiments, as for example shown in FIG. 4B, the electrically conductive material 106U may be printed or sprayed onto both, the second main surface of the first chip 102, 102W and the first main surface of the second chip 104W.

As shown in FIG. 3B and FIG. 4B, also for the second chip 104, which may be diced into individual second chips 104 when they are fixed on the first chip 102, the paste 106U may be sprayed or printed on while the second chips 104 are still part of a wafer 104W.

Figure 2C:
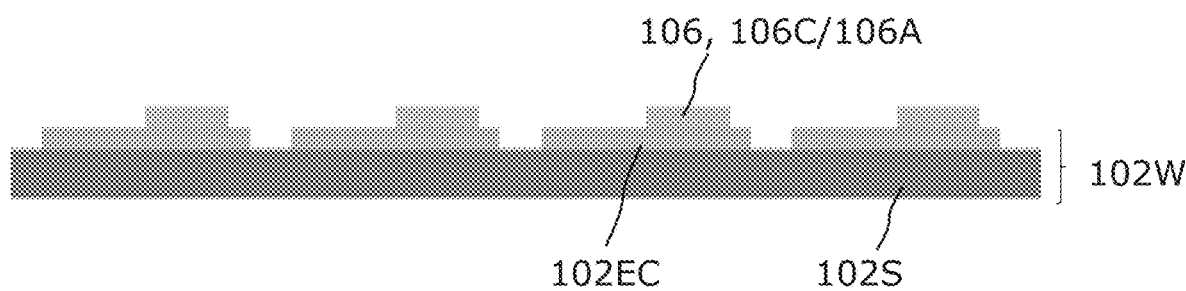
Figure 3C:
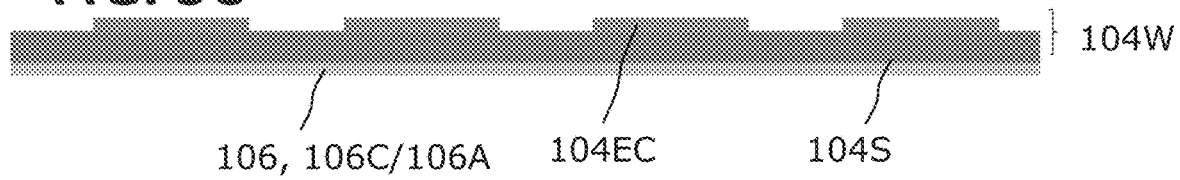
Figure 4C:
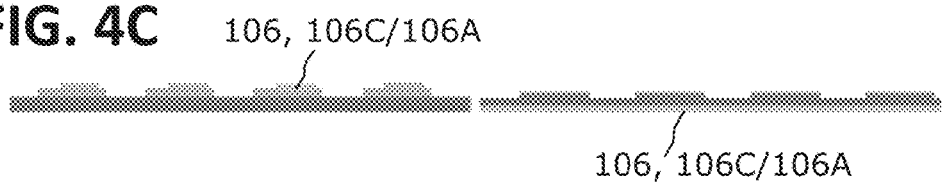

In various embodiments, as for example indicated in FIGS. 2C, 3C, and 4C, the electrically conductive material 106, 106U may be cured, which may include a heating of the electrically conductive material 106, 106U to remove organic components, e.g. solvents and the like. The curing may be performed under an atmosphere that may depend on the materials involved, for example an inert or reducing atmosphere, e.g. in a case of copper for the electrically conductive material 106, 106U.

In a case of the metal paste 106, 106U, the curing may cause the layer 106U to form the porous electrically conductive material 106, 106C, which may include or consist of connected open pores. During the curing process, the metal paste 106, 106U may shrink in thickness.

Figure 2D:
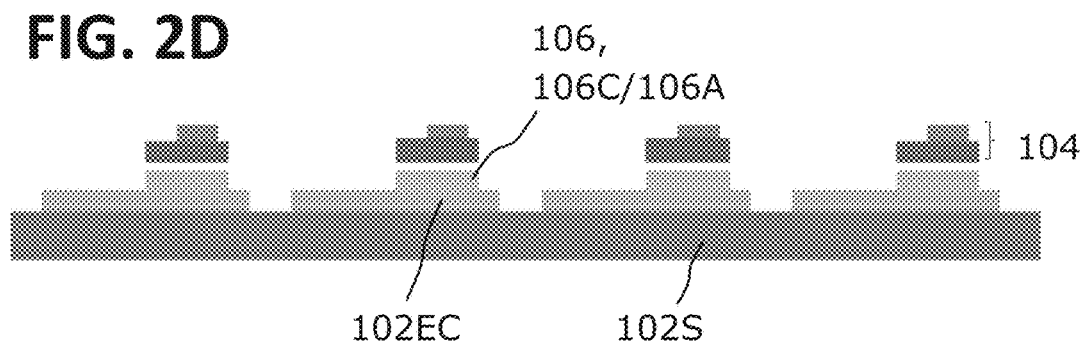
Figure 3D:
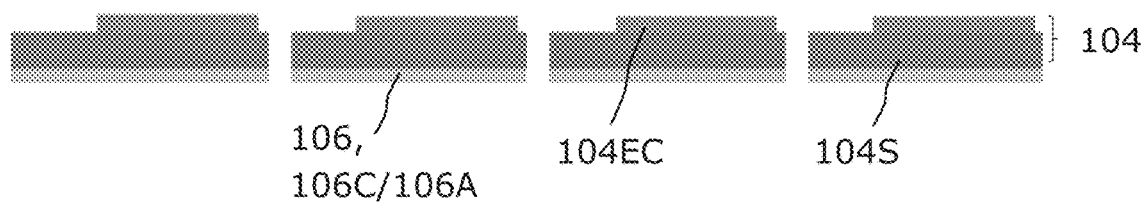
Figure 3E:
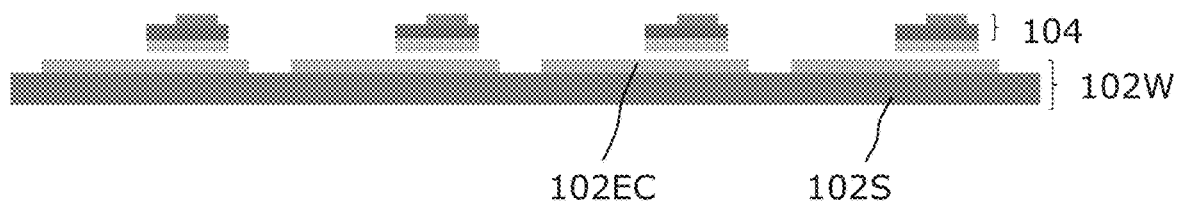
Figure 4D:
Figure 4E:
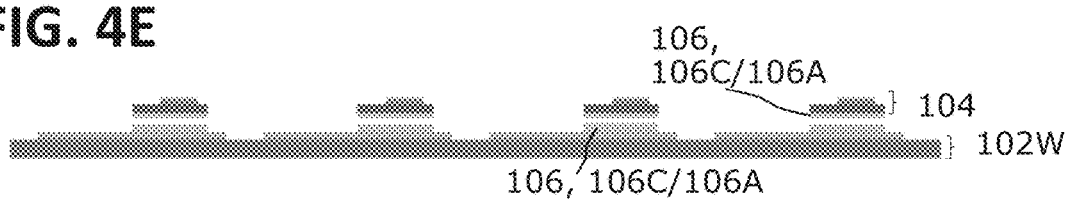

In various embodiments, as for example indicated in FIGS. 2D, 3D, and 4D, the cured porous layer 206U may be hardened to form the fixed electrically conductive interface 106, 106P between the first chip 102 and the second chip 104. The hardening may be a frontend (FE) process.

The hardening may in various embodiments include pressing the first chip 102 and the second chip 104 together. While the first chip 102 may still be part of the wafer 102W, the second chip wafer 104W may be separated into a plurality of second chips 104, such that the individual second chips 104 may be pick-and-placed on the first chip wafer 102W.

Additionally, during the pressing, the electrically conductive material 106 may be heated, which typically involves heating also the first chip 102 and the second chip 104. Further additionally, the pressing may be performed in a controlled atmosphere, e.g. an inert atmosphere or a reducing atmosphere.

The pressing may be performed as a sintering process, also referred to as thermocompression. For example, in a case of copper as the electrically conductive material 106, this may involve a temperature of about 400° C. and a pressure of about 50 MPa, which may be applied for at least five minutes. In a case of using other materials, e.g. silver, gold, or a combination or an alloy thereof, process parameters of the thermocompression may be adjusted accordingly.

The sintering may cause diffusion processes in the cured metal paste 106C that may first lead to a formation of sintering necks, and thereafter to a seamless, but porous interface 106 between the two chips 102, 104, i.e. between their semiconductor surfaces, or between the first metal portion and the second metal portion, respectively.

In various embodiments, thermosonic bonding may be used for the forming the fixed electrically conductive interface 106 between the first chip 102 and the second chip 104.

Thermosonic bonding means that, in addition to heat and pressure, ultrasonic energy is applied to the electrically conductive material 106C. The thermosonic bonding is explained in further detail below in context with FIG. 8A to 11.

In a case of the electrically conductive glue as the electrically conductive material 106, polymerisation may be initiated, for example by heating and/or ultraviolet light, for forming a durable, electrically conductive adhesive connection as the fixed electrically conductive interface 106.

Figure 4F:
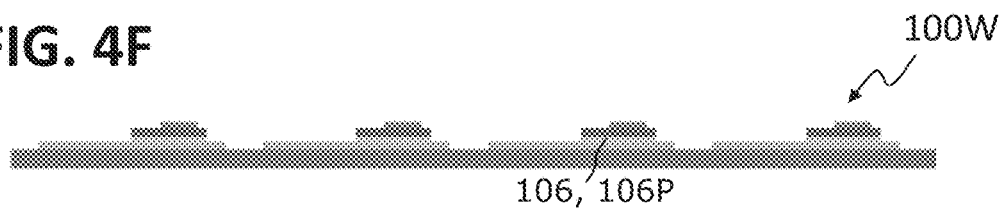
Figure 4G:

After the hardening, further processing as known in the art may be applied, for example annealing (as for example indicated in the transition from FIG. 4E to FIG. 4F) and thinning the wafer 102W from the backside, and dicing (from FIG. 4F to FIG. 4G).

Yet further processing may for example include connecting chip contact pads with bond wires 108 and/or with a leadframe 110, as for example shown in FIG. 1A, and encapsulating the multi-chip device 100 with encapsulation material 112 to form a multi-chip package 101, which is for example shown in FIG. 1B.

The above described process has been tested with a porous interconnect 106 formed from a stencil-printed copper sinter paste 106U. The copper sinter paste 106U was cured by drying at 100° C. and subsequent annealing by heating to 400° C. under a reducing atmosphere (HCOOH) for removing organic paste components and for forming an open-pored, electrically conductive network/foam structure.

The hardening includes forming a sinter interconnect 106 between the first chip 102 and the second chip 104 as a frontend process, using a pressure of less than 50 MPa between the first chip 102 and the second chip 104 at a temperature of below 400° C. under an inert atmosphere.

Figure 5A:
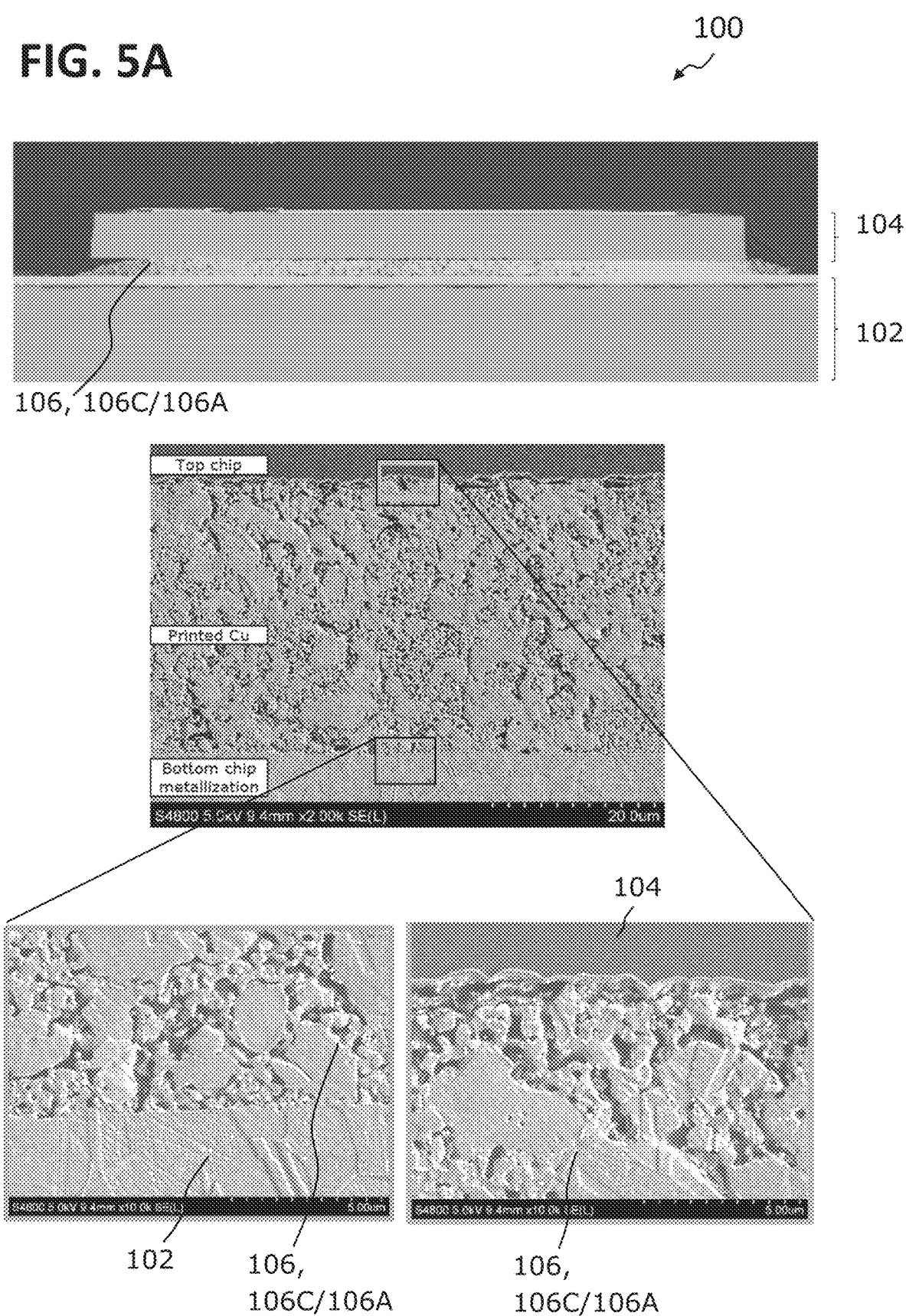
FIG. 5B shows cross-sectional microscopic views of a multi-chip device in accordance with various embodiments.
Figure 5B:
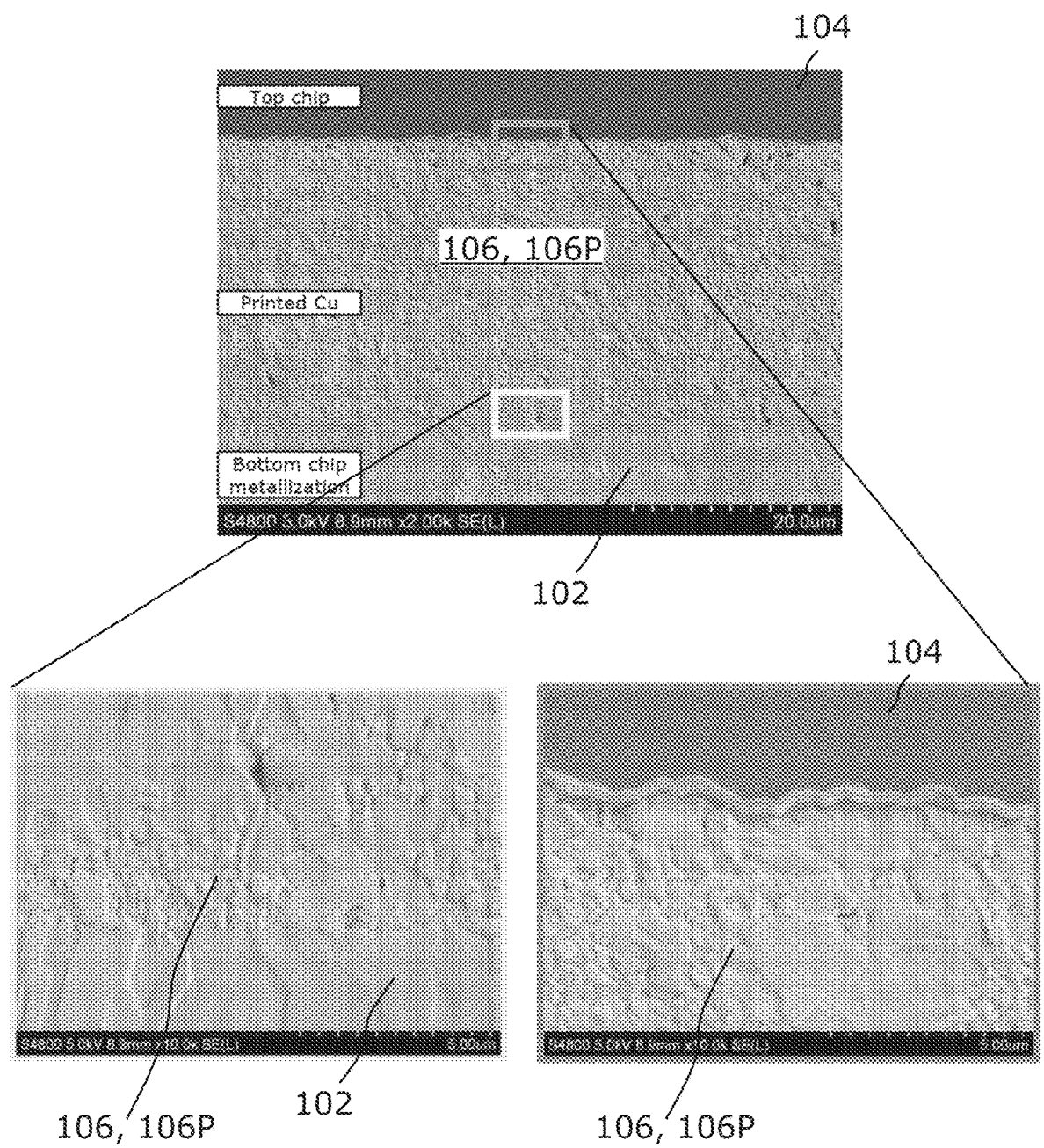

FIG. 5A and FIG. 5B each show cross-sectional microscopic views of a multi-chip device 100 in accordance with various embodiments. FIG. 5A shows an exemplary overview at the top, and zoomed-in views below, while FIG. 5B shows only zoomed-in views.

Depending on the processing parameters, the metal sinter interconnect 106 may be densely pressed (as for example shown in FIG. 5B), or may remain with a certain amount of porosity (as for example shown in FIG. 5A), for example at a level as described above.

Figure 6A:
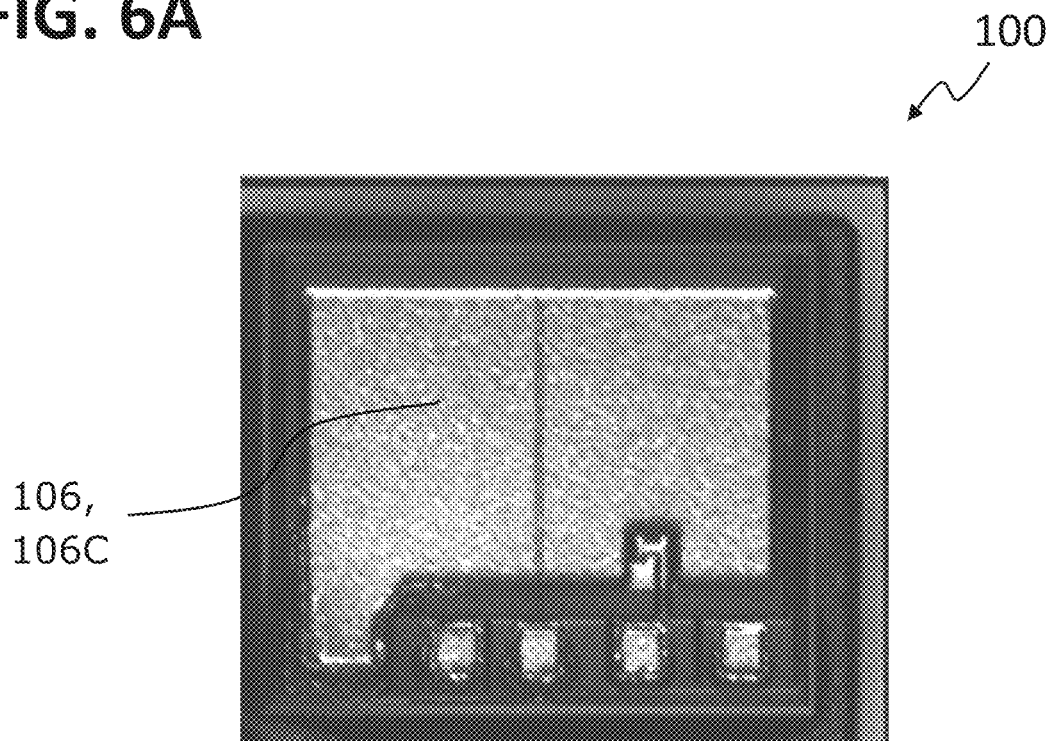
FIG. 6A shows a microscopic image of a layer of printed or sprayed electrically conductive material configured to form a fixed electrically conductive interface between a first chip and a second chip in a multi-chip device in accordance with various embodiments before a mounting of the second chip.
Figure 6B:
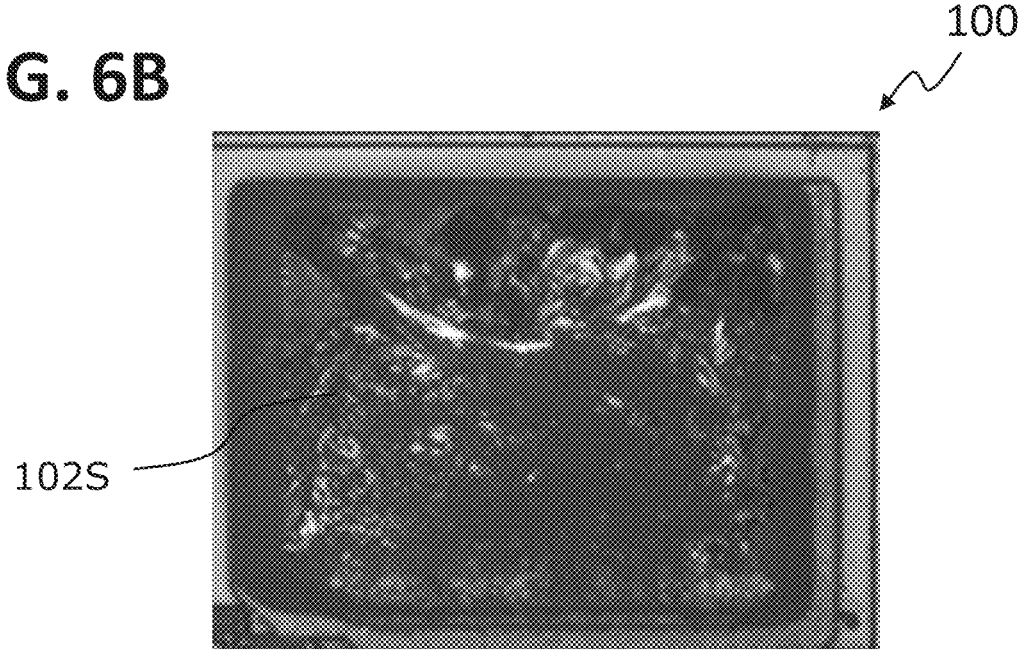
FIG. 6B shows a microscopic image of the multi-chip device of FIG. 6A after the mounting of the second chip and after having performed a shear test on the device.

The fixed electrically conductive interface 106 formed in accordance with various embodiments, for example as described above or below, may have a high shear strength. This is demonstrated by FIG. 6A and FIG. 6B. FIG. 6A shows a microscopic image of a layer of printed or sprayed electrically conductive material 106C configured to form a fixed electrically conductive interface 106 between a first chip (covered by the electrically conductive material 106C) and a second chip (not mounted yet, thus not shown) in a multi-chip device 100 in accordance with various embodiments before a mounting of the second chip 104. FIG. 6B shows a microscopic image of the multi-chip device 100 of FIG. 6A after the mounting of the second chip 104 and after having performed a shear test on the device 100. As can be seen in FIG. 6B, the shear test caused the semiconductor of the first chip 102 to break, rather than the fixed electrically conductive material 106.

Various embodiments may furthermore provide a low (electrical) resistance connection between two semiconductor devices 102, 104, e.g. power devices, at a wafer level.

Figure 7:
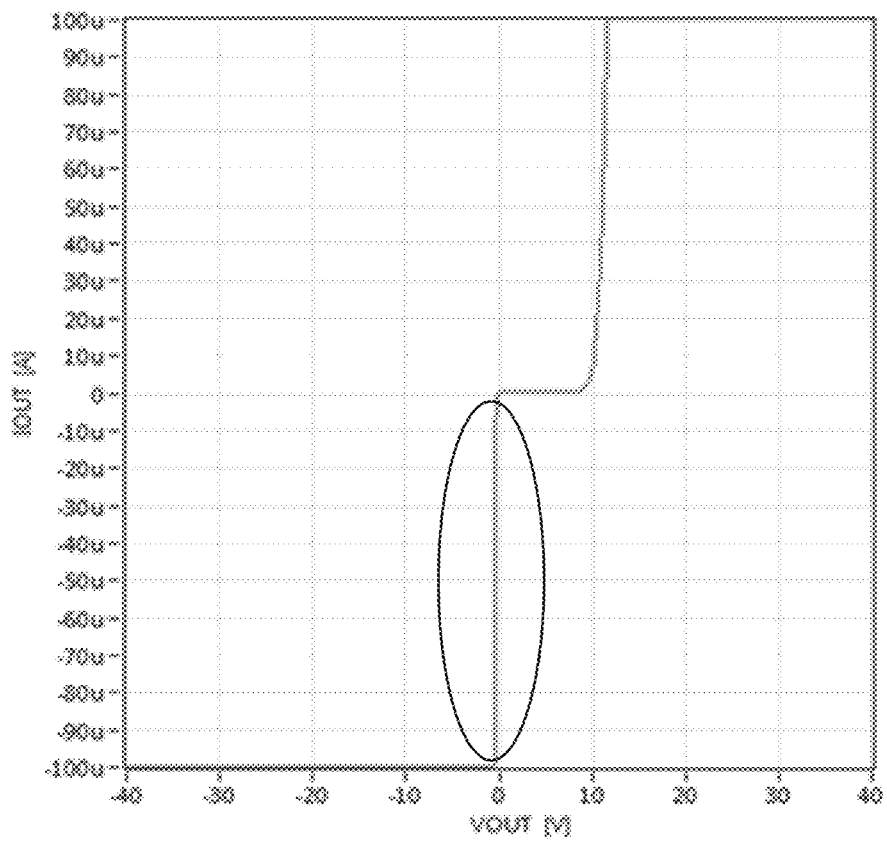
FIG. 7 shows a graphic visualization of electrical measurements performed on a multi-chip device in accordance with various embodiments.

The low resistance is demonstrated in FIG. 7, which shows a current-voltage-curve as a graphic visualization of a measurement of a serial resistance between the first chip 102 and the second chip 104 of a multi-chip device 100 formed in accordance with various embodiments.

The very steep incline of the current-voltage-curve below 0 V indicates that the interconnect has a very low resistance, and may be able to provide an interconnect quality that may be about as good as interconnects formed by known methods, for example a sinter paste and an electrically conductive glue.

In various embodiments, the above described method of forming a multi-chip device 100 may mean that the printing or spraying of the paste 106 and the chip stacking in frontend may mean that fewer backend (BE) processes are needed than with the current method.

In various embodiments, Rchain may be improved by more than a factor three over current configurations for all BE sites.

In various embodiments, the above described method may be used for fixing the second (top) chip 104 on the first (bottom) chip wafer 102W, which may lead to a reduction of a degree of freedom for chip-warping that may occur during a curing or annealing as a part of backend processing.

In various embodiments, the chip bonding during FE processing may mean that a risk of contamination of the surfaces to be bonded, e.g. of the first metal portion and of the second metal portion, may be lowered as compared to a process where the bonding occurs late in the process, i.e. during BE processing.

In various embodiments, an efficiency may be increased, because several hundreds or thousands of second chips 104 may be bonded to their corresponding first chips 102 at the same time, since the first chips 102 may, at the time of bonding, be part of the wafer 102W.

In various embodiments, costs for material may be reduced, since a printing or spraying of the electrically conductive material 106 at wafer level may lead to a higher homogeneity than a dispensing of the electrically conductive material 106, e.g. during backend processing.

The above described fixed electrically conductive interface 106, in particular if the sintered interface is formed, may in various embodiments have a higher electrical and thermal conductivity than comparable solder pastes or glues. Thereby, a heat transport at a chip 102/chip 104-interface may be increased.

In various embodiments, pure copper interconnects may be formed, for example by using a copper sinter paste between a copper seed layer (not shown) of the second (top) chip 104 and a copper metallization of the first (bottom) chip 102. Thereby, a reliability may be improved.

In various embodiments, the low resistance interconnect 106 may be used in any kind of system that may benefit from an electrically conductive interconnect 106 with low resistance and high strength, e.g. shear strength, between different frontend technologies, in particular for a low-resistance serial connection in a bridge configuration.

Figure 8A:
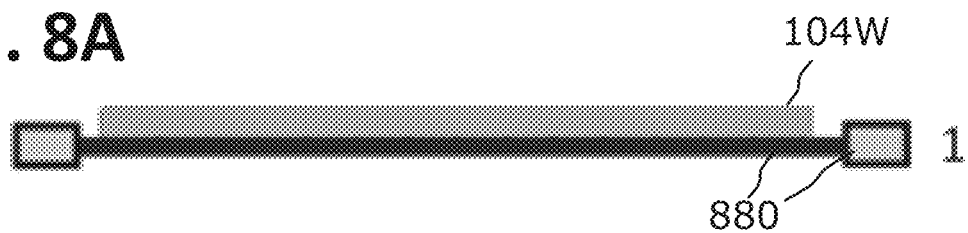
FIG. 8A to 8F are visualizations of a method of manufacturing a multi-chip device in accordance with various embodiments.
Figure 8B:
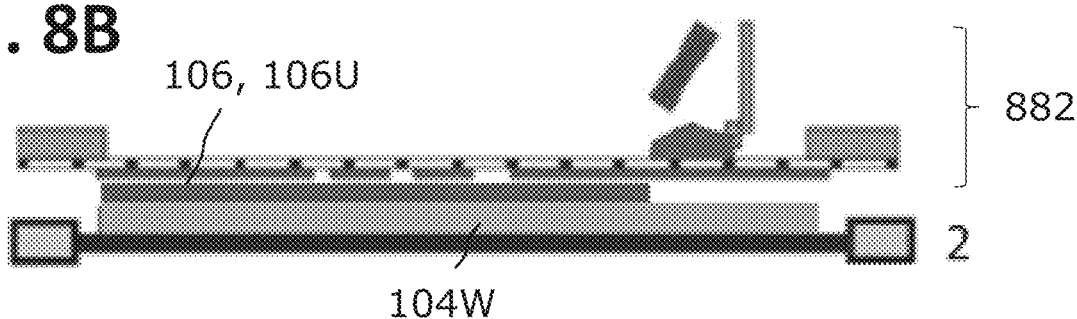

The thermosonic bonding that may in various embodiments be used as the hardening process, i.e. for forming the fixed electrically conductive interface 106 between the first chip 102 and the second chip 104 will be discussed in more detail with reference to FIGS. 8A to 11. FIG. 8A to 8F are visualizations of a method of manufacturing a multi-chip device 100 in accordance with various embodiments, FIG. 9 shows a cross-sectional schematic view of a device 900 for manufacturing a multi-chip device in accordance with various embodiments, FIG. 10 visualizes a working principle of thermosonic bonding, and FIG. 11 shows, as a microscopic cross-sectional image, a copper-copper (Cu—Cu) interface of a multi-chip device after thermosonic bonding and annealing in accordance with various embodiments.

For the thermosonic bonding of two chips 102, 104, an initial processing may include forming a metal layer 106, e.g. a copper or a silver layer, on one of the main surfaces of each of the chips 102, 104. This may be performed at a wafer level, as can for example be seen in FIG. 8B (for the second chip 104 as part of a wafer 104W) and FIG. 8E (here, the metal layer 106 is already present on the first wafer 102W and thus on the first chips 102).

The process of FIG. 8A to FIG. 8F may in various embodiments be similar to the process described in context with FIG. 4A to 4G for the case of thermosonic bonding.

The forming the metal layers 106 may include spraying or printing the metal layers 106, e.g. as described above in context with FIG. 4A to 4G. However, as an electrically conductive material 106 for the thermosonic bonding, also a metal layer 106 formed by, for example, electroless or electroplating may be used.

Furthermore, the thermosonic bonding may not be limited to bonding chip-to-wafer or chip-to-chip. Instead, essentially any other copper, copper-silver or silver bonding structure may be formed using thermosonic bonding, for example for bonding a chip to a leadframe, or a chip on a Direct Copper Bonding (DCB) or Active Metal Bonding (AMB) substrate, or for bonding wafer-on-wafer. The metals used for the thermosonic bonding may include or consist of Cu, Ag or other metals traditionally used for bonding. Even though the process may be described in the following mainly with reference to a copper-copper (Cu—Cu) bonding, the description may apply in a similar way to the thermosonic bonding of Cu—Ag, Ag—Ag, or other suitable metals.

As shown in the table below, which provides a comparison among two technologies for 3D die stacking with all-Cu interconnects, by introducing the ultrasonic energy, Cu—Cu bond formation can take place at significantly lower bonding temperature, static pressure, and time.

| Technique | Temperature | Pressure | Time |
| --- | --- | --- | --- |
| Cu—Cu Thermocompression (state of the art) | 400° C. | 50 MPa | >5 min |
| Cu—Cu Thermosonic bonding | <180° C. | <4 MPa | <50 sec |

In various embodiments, the thermosonic bonding process will take only a few seconds, which can increase a yield and throughput of a stacking process.

All-Cu interconnect technology may be a preferable choice for semiconductor industries, since it not only has excellent electrical and mechanical properties, but also has an excellent electromigration resistance.

Existing direct Cu—Cu technologies, which may typically be used in 3D IC stacking, may often require extensive surface preparation or activation, such as chemical-mechanical polishing (CMP), bonding in vacuum or controlled atmospheres, or at temperatures far exceeding that of traditional solder-based reflows with long annealing times at high temperature for interdiffusion and recrystallization, thus limiting their applicability to high-volume manufacturing.

In various embodiments, using an optimized set of bonding parameters (ultrasonic energy, bonding temperature, and pressure), a process window may be derived to efficiently remove a native copper oxide layer, which may facilitate a copper-copper (Cu—Cu) contact and assure reliable bonding.

Ultrasonic bonding of Cu—Cu is used extensively in wire bonding and even has recently been applied to Cu-pillar bonding.

In various embodiments, the ultrasonic bonding process may be modified to a thermo-sonic bonding process of Cu—Cu for die-stacking that may be able to solve all the issues with the existing technologies.

In thermosonic bonding, large areas similar to the size of a die 104 (approximately 4 mm$^2$) may be bonded or tacked to the counterpart 102 with a minimum temperature and pressure budget.

In various embodiments, a low temperature 3D IC stacking process may be facilitated by using only Cu interconnects. The sequential process of the proposed 3D die-stacking using an ultrasonic tool 884 is shown in FIG. 8A to 8E and may be as follows:

In various embodiments, a surface preparation of the second wafer 104W may be followed by Cu-seed layer metallization. A result of this process is shown in FIG. 8A.

Figure 8C:
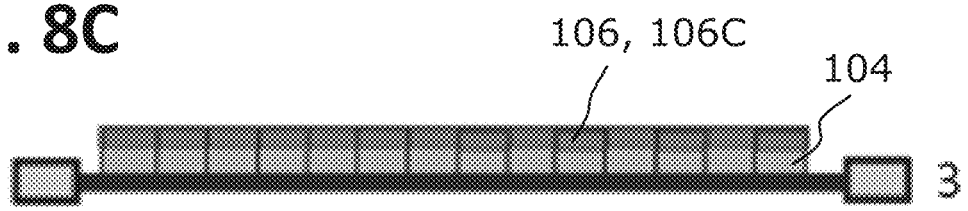
Figure 9:
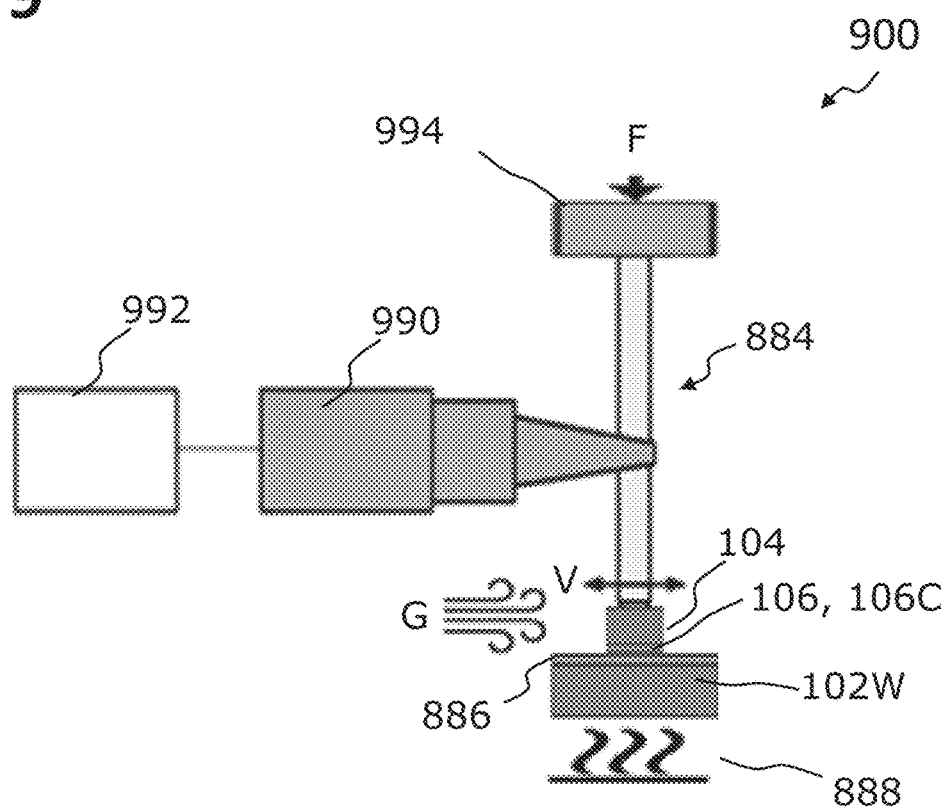
FIG. 9 shows a cross-sectional schematic view of a device for manufacturing a multi-chip device in accordance with various embodiments.

In various embodiments, screen or stencil printing of Cu paste 106, 106U (see FIG. 8B) may be followed by drying/curing/annealing (to form the cured Cu paste 106, 106C, and by wafer dicing (see FIG. 8C).

Figure 8D:
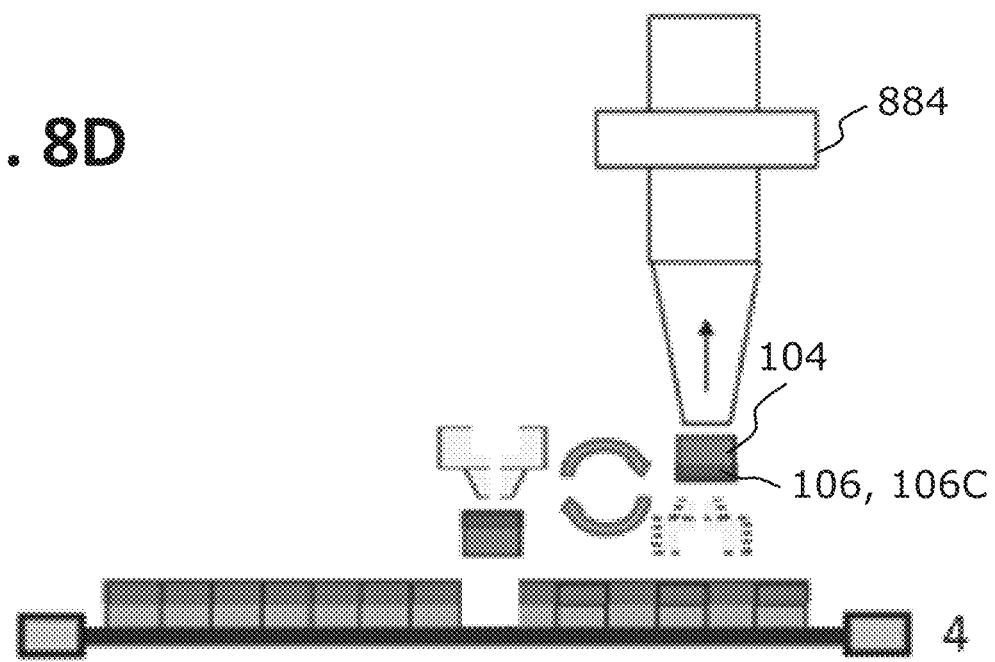

Thereafter, the chip 104 may in various embodiments be flipped, followed by die-picking by the ultrasonic tool 884 (see FIG. 8D).

Figure 8E:
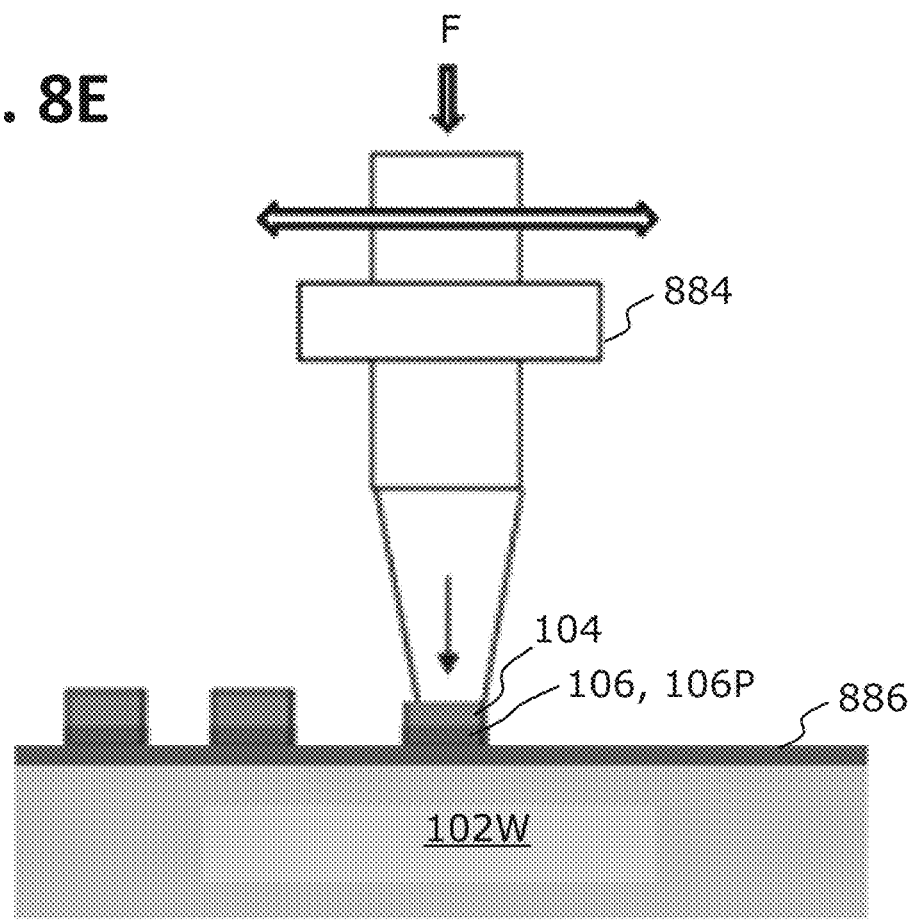

Alignment and precise die-placement over a corresponding counterpart (e.g. a wafer 102W with a Cu layer 106 having a thickness of at least 150 nm), and pre-heating (to at least 100° C., but less than 180° C.) to enhance tacking in milliseconds (typically about 300 ms) via ultrasonic vibration V (at a power of about 5 to 10 W) and static pressure F (of typically about 4 MPa) (see FIG. 8E).

Figure 8F:
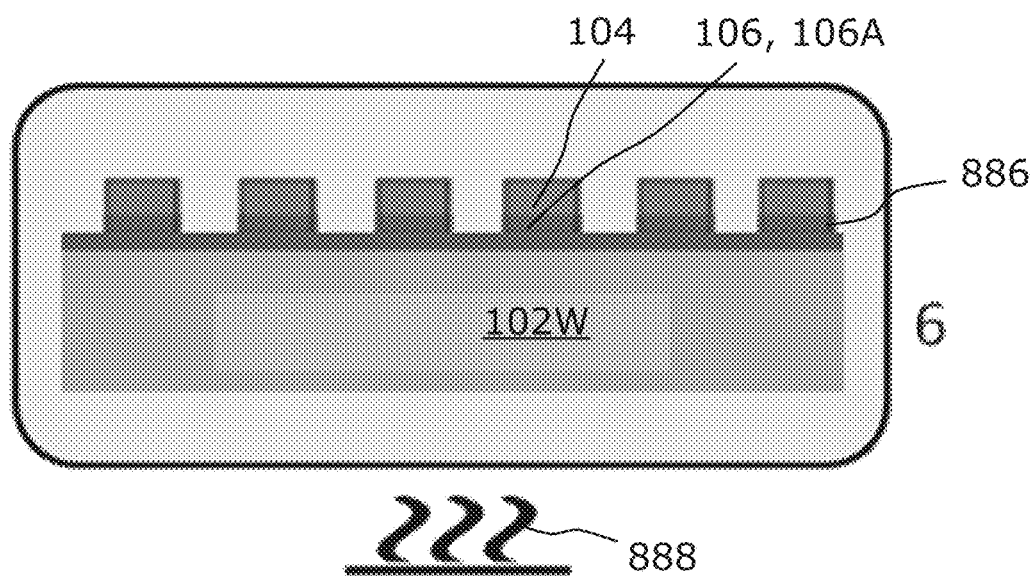

Global heating under reducing atmosphere (e.g. formic acid vapour in nitrogen), as for example shown in FIG. 8F, may in various embodiments optionally be applied to enhance the interfacial diffusion and to improve bonding strength.

In various embodiments, both counterparts, the first chip 102 as part of the wafer 102W, and the second chip 104, need metallized surfaces (e.g. Cu, Ag), one in the form of a thin bulk layer (e.g., less than about 500 nm in thickness), and the other may need a thicker, porous layer (e.g., having a thickness of about 5 to 30 µm).

In various embodiments, a propagation of the ultrasonic energy V from the ultrasound horn 884 to the chip 104 (or 102, respectively) and the copper 106 may depend on the ultrasonic power and the bond force. Applying the pressure (bond force) and ultrasonic energy may initiate an adhesion between contact areas of the copper layers 106, thereby establishing a solid connection 106. In a similar manner, also here, a compromise between the bonding force F and ultrasonic energy V may need to be made. While an excessive force F may adversely affect the efficiency of ultrasonic vibration V, insufficient force F may also be able to cause the die 104 to shift away upon vibration.

The modified thermo-sonic bonding process of Cu—Cu for die-stacking may be able to solve all the issues with the existing technologies. FIG. 9 shows a schematic demonstration of thermosonic bonding. In this example, instrumentation 900 for an all-copper die-stacking is shown. The instrumentation 900 may include an ultrasonic horn 884 that may include an oscillator 990 driven by a power supply 992, a heat source 888, and a device 994 for applying the static force F. Furthermore, a gas supply may be provided for supplying the gas G to an area where the thermosonic bonding is occurring.

Figure 10:
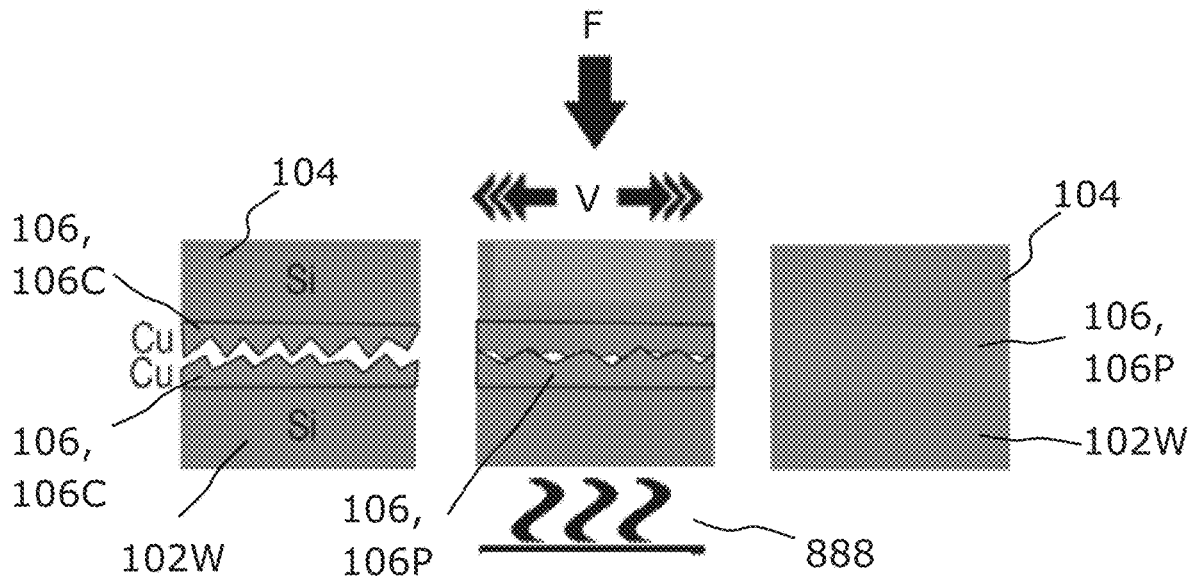
FIG. 10 visualizes a working principle of thermosonic bonding.
Figure 11:
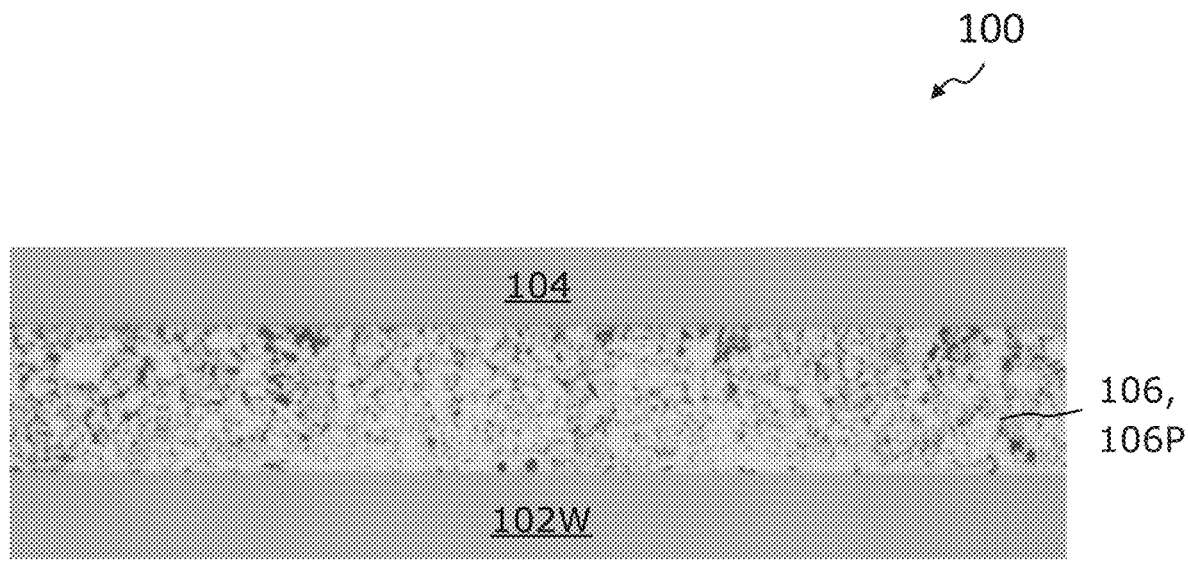
FIG. 11 shows, as a microscopic cross-sectional image, a copper-copper (Cu—Cu) interface of a multi-chip device after thermosonic bonding and annealing in accordance with various embodiments.

The mechanism of Cu—Cu bonding using a thermosonic process is depicted in FIG. 10. Ultrasonic energy V may be the most important parameter of thermosonic bonding. In various embodiments, the ultrasonic energy V, which may be applied in such a way (e.g., using an oscillator that the vibration may cause a motion of the chip 104 that may be parallel to its first main surface. In various embodiments, the interface may cause the deformation-induced vibration, which may enhance bond formation. The ultrasonic energy V may cause a rise in temperature and may accelerate a bond formation by increasing the contact area. Hence, a compromise between the bonding temperature and the ultrasonic energy V may be regarded as the key criterion for delicate stacking of dies 102, 104 with Cu metallization. Excessive ultrasonic energy may have easily been migrating into micro-cracks in the die 108, which may lead to cracks.

In various embodiments, a surface roughness of the Cu metallization may, as described above, be of the order of a few hundred nanometers, and a formation of native Cu oxide, which may have a thickness in a range of a few nanometers, may be unavoidable. The bonding may be performed in a protected gas atmosphere (e.g. formic acid vapor) to avoid extra oxidation.

In various embodiments, the thermosonic bonding process nay uses ultrasonic vibrations V to create a friction-like relative motion between two surfaces (surfaces of copper layers 106) that are held together under pressure. This action, in turn, may cause shearing and plastic deformation between asperities of the opposing surfaces, which may disperse the surface oxides and potential (other) contaminants. As the asperities collapse, a Cu—Cu contact may be increased, creating a solid-state bonding between the parts through heat and pressure, as for example shown in FIG. 10.

FIG. 11 shows, in a microscopic cross-sectional image, a copper-copper (Cu—Cu) interface of a multi-chip device 100 that includes the first chip 102, the second chip 104, and the interconnect 106 after the thermosonic bonding and annealing in accordance with various embodiments.

In summary, various embodiments may provide a process flow that is beneficial for semiconductor manufacturing with respect to technical simplicity, cost and efficiency in order to generate chip to chip metal interconnects on wafer level.

The thermosonic bonding may provide for at least three clear benefits: (I) The process conditions may be very mild with respect to thermal and mechanical stress. (II) The process may well be applicable for a high-volume production, since the time consuming process (thermal annealing after the ultra-sonication process) may be carried out as a batch process with a large number of wafers 102W at the same time. (III) Furthermore, it may not be required to achieve a very high degree of uniformity in height of the stacked chips on the substrate wafer compared to the state of the art process (thermocompression bonding) when all placed chips need to be compressed at the same time using a compression tool.

The Cu—Cu thermosonic die-stacking process with the Cu metallization layers 106 hast been tested. The effects of bond parameters ultrasonic energy, bond force, time, bond temperature and bonding atmosphere to relative bond strength were investigated. In addition to thermal stability, it may also be important for the bonded stack, e.g. the multi-chip device 100, to have a high shear strength to enable the die attachment to survive mechanical stress, such as may be encountered during subsequent processing steps and/or during use of the device, without delaminating.

Therefore, bonded and tempered components were subjected to a die shear test to examine the bond strength. Cross section and SEM were used to inspect bond interface and Cu—Cu deformation.

In various embodiments, a successful bonding was obtained when the ultrasonic power V was around 6 W, while the temperature was only around 100° C. and the bonding force F was around 10 N. The actual process only takes several milliseconds, while the preheating and post heating was applied for only 40 seconds.

First results show a shear strength of up to 50 MPa for thermosonic bonded dies, which were annealed afterwards at 400° C. for three hours.

Figure 13:
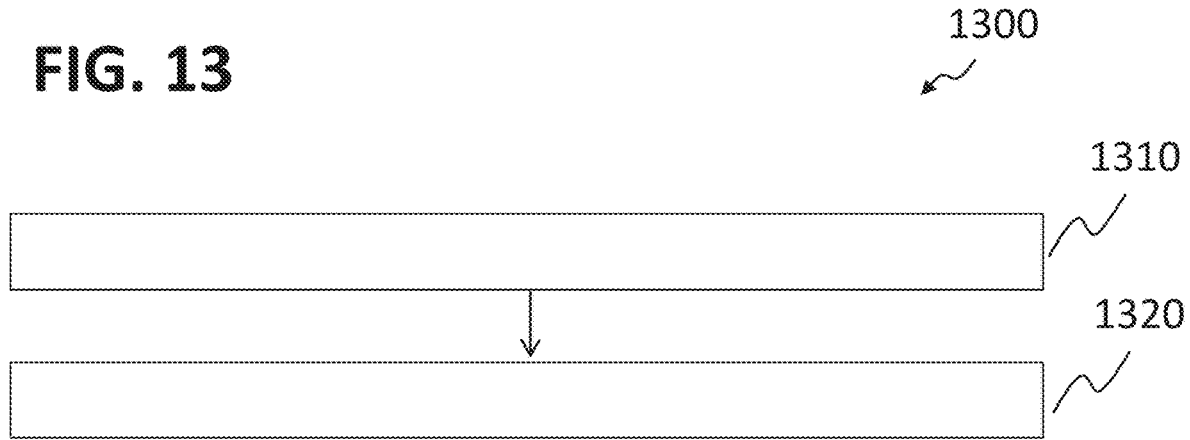
FIG. 13 shows a flow diagram of a method of manufacturing a multi-chip device in accordance with various embodiments.

FIG. 13 shows a flow diagram of a method 1300 of manufacturing a multi-chip device in accordance with various embodiments.

The method may include printing or spraying an electrically conductive material on a first metal portion of a first chip and/or on a second metal portion of a second chip (in 1310), and hardening the printed or sprayed electrically conductive material to form a fixed electrically conductive interface between the first chip and the second chip, thereby reducing the porosity of the electrically conductive material (in 1320).

Various examples will be illustrated in the following:

Example 1 is a multi-chip device that includes a first chip, a second chip mounted on the first chip, and a hardened printed or sprayed electrically conductive material forming a sintered electrically conductive interface between the first chip and the second chip.

In Example 2, the subject-matter of Example 1 may optionally include that the sintered electrically conductive interface is a porous material.

In Example 3, the subject-matter of Example 1 or 2 may optionally include that the sintered electrically conductive interface has a porosity in the range from about 2% to about 60%.

In Example 4, the subject-matter of any of Examples 1 to 3 may optionally include that the printed or sprayed electrically conductive material is a paste including microparticles or nanoparticles.

Example 5 is a multi-chip device that includes a first chip having a first metal portion, a second chip having a second metal portion which is smaller than the first metal portion, and a sintered electrically conductive material, wherein the second metal portion is mounted on the first metal portion via the sintered electrically conductive material, wherein the sintered electrically conductive material has a first region uncovered by the second metal portion and a second region covered by the second metal portion, wherein the first region has a higher surface roughness than the second region.

In Example 6, the subject matter of Example 5 may optionally include that the sintered electrically conductive material has a third region uncovered by the second metal portion and a fourth region covered by the second metal portion, wherein the third portion has a higher porosity than the fourth region.

In Example 7, the subject matter of Example 5 or 6 may optionally include that the sintered electrically conductive material includes a first electrically conductive material at least partially covering the first metal portion, and a second electrically conductive material at least partially covering the second metal portion.

In Example 8, the subject matter of Example 7 may optionally include that the first electrically conductive material consists of or essentially consists of the same material as the second electrically conductive material.

In Example 9, the subject-matter of any of Examples 1 to 8 may optionally include that the sintered electrically conductive material is formed by thermosonic bonding.

In Example 10, the subject-matter of any of Examples 1 to 9 may optionally include that the sintered electrically conductive material includes or consists of copper, silver, gold, or of alloys thereof.

In Example 11, the subject-matter of any of Examples 6 to 10 may optionally include that the porosity in the third region is in a range from above 2% to about 90%.

In Example 12, the subject-matter of any of Examples 6 to 11 may optionally include that the porosity in the fourth region is in a range from 2% to about 60%.

In Example 13, the subject-matter of any of Examples 5 to 12 may optionally include that the surface roughness in the first region is in a range from about 100 nm to about 50 µm.

Example 14 is a multi-chip package that includes a multi-chip device of any one of examples 1 to 13, a substrate; wherein the first chip is connected to the substrate, and encapsulation material encapsulating at least a portion of the multi-chip device and of the substrate.

Example 15 is a method of manufacturing a multi-chip device, the method including printing or spraying an electrically conductive material on a first metal portion of a first chip and/or on a second metal portion of a second chip, and sintering the printed or sprayed electrically conductive material to form a sintered electrically conductive interface between the first chip and the second chip, thereby reducing the porosity of the electrically conductive material.

In Example 16, the subject-matter of Example 15 may optionally include that the sintering includes pressing together the first chip and the second chip and heating at least the electrically conductive material.

In Example 17, the subject-matter of Example 16 may optionally further include applying ultrasonic energy to the first chip and/or to the second chip during the sintering.

In Example 18, the subject-matter of Example 17 may optionally include that the ultrasonic energy is provided in such a way that it causes a relative lateral motion between the first chip and the second chip.

In Example 19, the subject-matter of Example 17 or 18 may optionally include that the heating comprises heating the electrically conductive material to a temperature of 100° C. or more, and less than 180° C.

In Example 20, the subject-matter of any of Examples 17 to 19 may optionally include that the pressing includes applying a pressure of more than 1 MPa and less than 4 MPa.

In Example 21, the subject-matter of any of Examples 15 to 20 may optionally include that a thickness of the electrically conductive material directly after the printing or spraying is between 5 µm and 1 mm.

In Example 22, the subject-matter of any of Examples 15 to 21 may optionally include that the electrically conductive material is a porous material.

In Example 23, the subject-matter of any of Examples 15 to 22 may optionally include that the electrically conductive material directly after the printing or spraying has a porosity in the range from above 2% to about 90%.

In Example 24, the subject-matter of any of Examples 15 to 23 may optionally include that the electrically conductive material after the hardening has a porosity in a range from about 2% to about 60%.

In Example 25, the subject-matter of any of Examples 15 to 24 may optionally include that the printed or sprayed electrically conductive material is a paste includes microparticles or nanoparticles.

In Example 26, the subject-matter of any of Examples 15 to 25 may optionally include that the printing or spraying and the sintering are performed on a wafer level.

In Example 27, the subject-matter of any of Examples 15 to 26 may optionally include that the electrically conductive material includes or consists of copper, silver, gold, or of alloys thereof.

Example 28 is a method of manufacturing a multi-chip package, the method including forming a multi-chip device according to the method of any one of examples 1 to 27, connecting the first chip of the multi-chip device to a substrate, and encapsulating at least a portion of the multi-chip device and the substrate with encapsulating material.

Example 29 is a method of forming a metal interconnect, the method including forming a first metal layer on a first substrate, the first metal layer including or consisting of copper and/or silver, forming a second metal layer on a second substrate, the second metal layer including or consisting of copper and/or silver; and forming a sintered electrically conductive interface between the first substrate and the second substrate by pressing the first substrate to the second substrate while applying heat and ultrasonic energy.

In Example 30, the subject-matter of Example 29 may optionally include that the ultrasonic energy is provided in such a way that it causes a relative lateral motion between the first chip and the second chip.

In Example 31, the subject-matter of Example 29 or 30 may optionally include that the heating includes heating the electrically conductive material to a temperature of 100° C. or more, and less than 180° C.

In Example 32, the subject-matter of any of Examples 29 to 31 may optionally include that the pressing includes applying a pressure of more than 1 MPa and less than 4 MPa.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of manufacturing a multi-chip device, the method comprising:
    printing or spraying an electrically conductive material on a first metal portion of a first chip and/or on a second metal portion of a second chip; and
    sintering the printed or sprayed electrically conductive material to form a sintered electrically conductive interface between the first chip and the second chip, during the sintering, applying ultrasonic energy to the first chip and/or to the second chip, such that a porosity of the electrically conductive material is reduced.

2. The method of claim 1, wherein the sintering comprises pressing together the first chip and the second chip and heating at least the electrically conductive material.

3. The method of claim 2, wherein the heating comprises heating the electrically conductive material to a temperature of 100° C. or more and less than 180° C.

4. The method of claim 2, wherein the pressing comprises applying a pressure of more than 1 MPa and less than 4 MPa.

5. The method of claim 1, wherein the ultrasonic energy is provided in such a way that a relative lateral motion occurs between the first chip and the second chip.

6. The method of claim 1, wherein the electrically conductive material is a porous material.

7. The method of claim 1, wherein directly after the printing or spraying, the electrically conductive material has a porosity in a range from above 2% to about 90%.

8. The method of claim 1, wherein after the sintering, the electrically conductive material has a porosity in a range from about 2% to about 60%.

9. The method of claim 1, wherein the printing or spraying and the sintering are performed on a wafer level.

10. A method of forming a metal interconnect, the method comprising:
    forming a first metal layer on a first substrate, the first metal layer comprising copper and/or silver;
    forming a second metal layer on a second substrate, the second metal layer comprising copper and/or silver; and
    forming a sintered electrically conductive interface between the first substrate and the second substrate, by pressing the first substrate to the second substrate while applying heat and ultrasonic energy.

11. The method of claim 10, wherein the ultrasonic energy is provided such that a relative lateral motion occurs between the first chip and the second chip.

12. The method of claim 10, wherein the applying heat comprises heating the electrically conductive material to a temperature of 100° C. or more and less than 180° C.

13. The method of claim 10, wherein the pressing comprises applying a pressure of more than 1 MPa and less than 4 MPa.

14. A method of manufacturing a multi-chip device, the method comprising:
    printing or spraying an electrically conductive material on a first metal portion of a first chip and/or on a second metal portion of a second chip; and
    sintering the printed or sprayed electrically conductive material to form a sintered electrically conductive interface between the first chip and the second chip and such that a porosity of the electrically conductive material is reduced,
    wherein the printing or spraying and the sintering are performed on a wafer level.

15. The method of claim 14, wherein the sintering comprises pressing together the first chip and the second chip and heating at least the electrically conductive material.

16. The method of claim 15, wherein the heating comprises heating the electrically conductive material to a temperature of 100° C. or more and less than 180° C.

17. The method of claim 15, wherein the pressing comprises applying a pressure of more than 1 MPa and less than 4 MPa.

18. The method of claim 15, wherein the pressing is performed in a controlled atmosphere.

19. The method of claim 18, wherein the controlled atmosphere is an inert atmosphere.

20. The method of claim 14, further comprising:
    during the sintering, applying ultrasonic energy to the first chip and/or to the second chip.

21. The method of claim 20, wherein the ultrasonic energy is provided in such a way that a relative lateral motion occurs between the first chip and the second chip.

22. The method of claim 14, wherein the electrically conductive material is a porous material.

23. The method of claim 14, wherein directly after the printing or spraying, the electrically conductive material has a porosity in a range from above 2% to about 90%.

24. The method of claim 14, wherein after the sintering, the electrically conductive material has a porosity in a range from about 2% to about 60%.

25. The method of claim 14, further comprising:
    treating the interconnect with ultraviolet light.

26. The method of claim 14, further comprising:
    annealing the interconnect.

* * * * *